United States Patent
Tsuruoka

[11] Patent Number: 5,117,202
[45] Date of Patent: May 26, 1992

[54] AUTOMATIC LEVEL CONTROL CIRCUIT

[75] Inventor: Yoshiyasu Tsuruoka, Nishinasunomachi, Japan

[73] Assignee: Fujitsu Limited, Kawasaki, Japan

[21] Appl. No.: 645,409

[22] Filed: Jan. 24, 1991

[30] Foreign Application Priority Data

Jan. 24, 1990 [JP] Japan .................................. 2-15420

[51] Int. Cl.5 ............................................ H03G 3/30
[52] U.S. Cl. ...................................... 330/279; 330/2;
330/298; 330/278; 330/286; 333/111
[58] Field of Search .............. 330/278, 2, 279, 127,
330/128, 129, 207 P, 298, 286; 455/116, 126,
127; 375/98; 333/111, 113, 116

[56] References Cited

U.S. PATENT DOCUMENTS

| 4,563,775 | 1/1986 | Yokosuka | 330/279 |
| 4,635,006 | 1/1987 | Praba | 333/111 |
| 4,679,011 | 7/1987 | Praba et al. | 333/111 |
| 4,814,780 | 3/1989 | Sterns et al. | 333/111 |
| 4,996,500 | 2/1991 | Larson et al. | 330/279 |

FOREIGN PATENT DOCUMENTS

| 60-244107 | 5/1984 | Japan | 330/279 |
| 63-175511 | 7/1988 | Japan | 330/279 |

Primary Examiner—Eugene R. Laroche
Assistant Examiner—Tan Dinh
Attorney, Agent, or Firm—Staas & Halsey

[57] ABSTRACT

Automatic Level Control (ALC) circuit having a directional coupler, for branching an output of an amplifier, and a detector, for detecting the branched output, is disclosed. When saturation of the amplifier is measured, coupling by the directional coupler is decreased and the input signal to the detector can be kept below a predetermined value.

6 Claims, 2 Drawing Sheets

AUTOMATIC LEVEL CONTROL CIRCUIT

BACKGROUND OF THE INVENTION (1) Field of the Invention

The present invention relates to an automatic level control circuit and particularly to an automatic level control circuit used in a transmitter.

(2) Description of the Related Art

In present digital radio transmission systems, multi-value modulation such as 64 QAM or 256 QAM has been introduced rapidly with improvement in effective use of frequency and in transmission capacity. Introduction of a multivalue modulation method requires, in the transmitter, an automatic level control (ALC) circuit for always maintaining the transmitting output at a constant level in view of suppressing a quantity of distortion generated in a high output amplifier by obtaining a large a saturation power as shown in FIG. 1. A ratio of the saturation power and operation power (back off) and by not generating an error in an adjacent channel or in the same channel.

FIG. 2 schematically shows an ordinary automatic level control circuit. In this circuit, a band-limited modulated signal wave is amplified by a high output amplifier 1. A part of the output of the amplifier 1 is branched by a directional coupler 2. The branched output is detected by a detector 3 and is converted to a DC output. The DC output is compared with a reference value. A gain control voltage of the amplifier 1 is controlled by the difference between the DC output and the reference value. Thus, the transmitting output is kept at a constant level.

Such automatic level control circuit uses, as shown in FIG. 3, a ¼ wavelength ($\lambda$) side couple type coupler as a directional coupler 2. This coupler uses the branching function explained. The structure includes microstrip lines 2a and 2b provided on a dielectric substrate (not illustrated) made of teflon. A termination resistor r of characteristic impedance (50Ω) is connected to the one end of the microstrip line 2b, while a diode 3 as a detector is connected to the other end of line 2b.

The high output amplifier 1 used for such automatic level control circuit has a problem that it searches a saturated power value for evaluating the performance thereof but it cannot realize automatic level control. This is because the back-off shown in FIG. 1 is set large and an excessive power is input to the diode 3 from the microstrip line 2b. This high output may harm the diode 3.

SUMMARY OF THE INVENTION

It is therefore an object of the present invention to prevent breakdown of a detector when the saturated power of the amplifier is measured in an automatic level control circuit for branching an output of a high output amplifier with a directional coupler and keeping an output of the amplifier constant by detecting the output with the detector.

The present invention realizes an automatic level control circuit wherein a directional coupler is provided with means for changing a degree of coupling at the coupling part for realizing directional coupling and an input of the detector is lowered by adjusting the dielectric coefficient changing means when the saturated power of the high output amplifier is measured.

DESCRIPTION OF THE PREFERRED EMBODIMENTS

Figure 1:
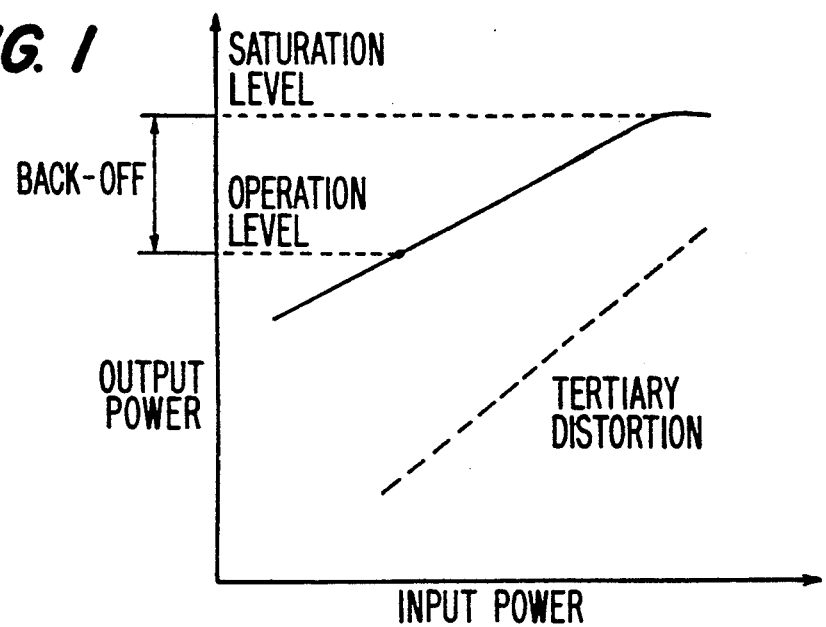
FIG. 1 is a graph indicating the input/output power characteristics of a high output amplifier used in a transmitter.
Figure 2:
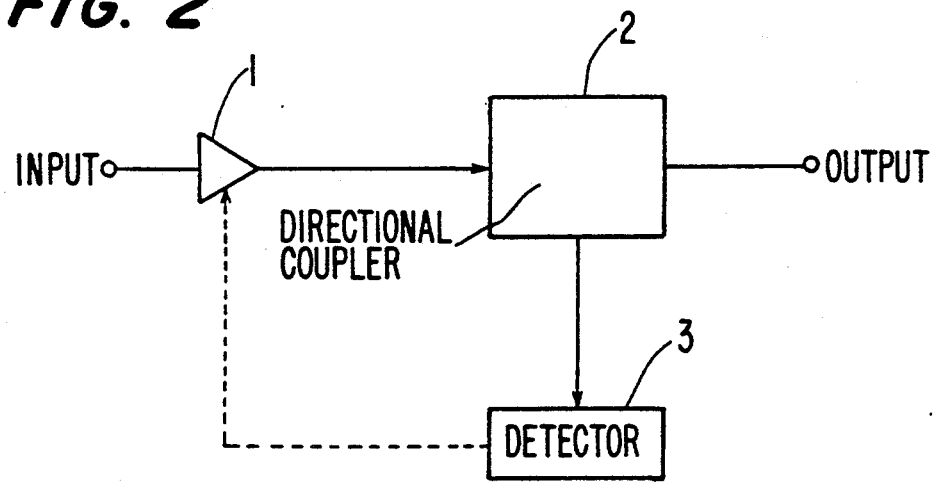
FIG. 2 is a block diagram of a structure of an ordinary automatic level control circuit.
Figure 3:
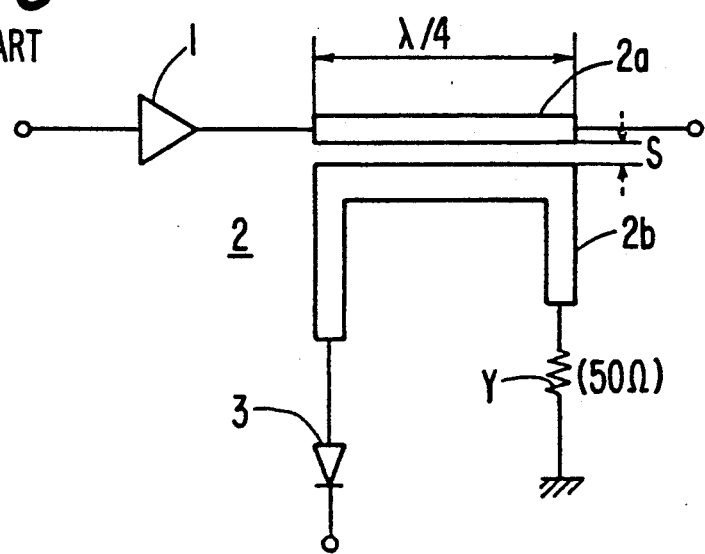
FIG. 3 is a diagram of a prior art directional coupler used in an automatic level control circuit.

A degree of coupling becomes small by making the coupling gap width S of the directional coupler 2 large by making the value S small.

The present invention pays attention to this point and provides a means 5 for changing dielectric coefficient of the gap 4 provided in the directional coupler 2 for substantially widening gap width S even when the gap width S cannot be varied and changes a degree of coupling by changing a dielectric coefficient of the gap 4 by adjusting the means 5.

As a result, when the saturated power of amplifier 1 is measured, the dielectric coefficient of gap 4 becomes small and a degree of coupling is reduced by adjusting the dielectric coefficient changing means 5. Thus, excessive input to the detector 3 can be prevented.

Figure 4:
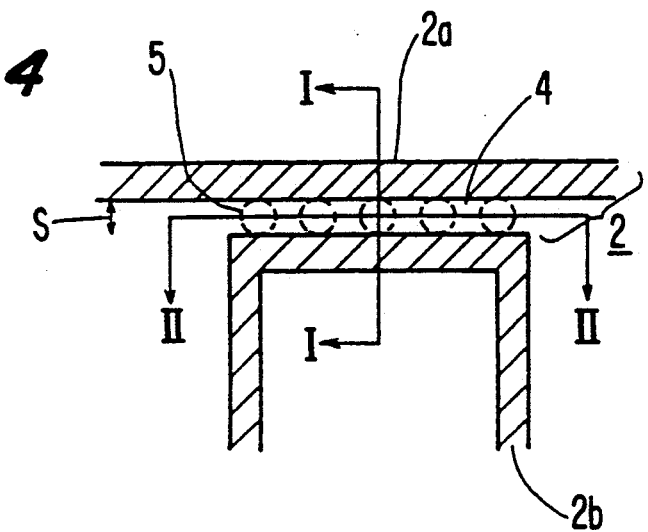
FIG. 4 is a plan view of a directional coupling part of an automatic level control circuit according to the present invention.
Figure 5:
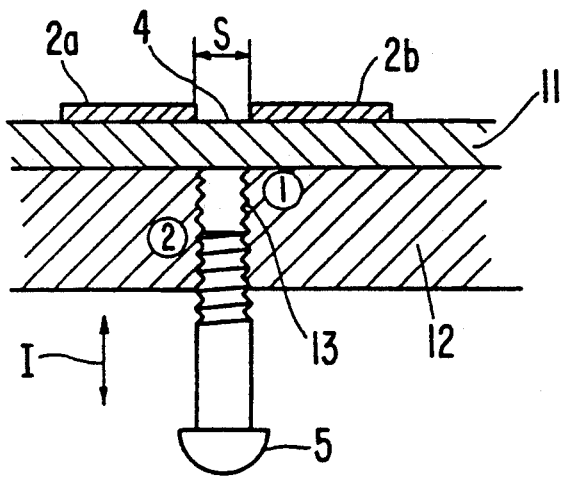
FIG. 5 is a sectional view taken along the line 1—1 of the directional coupler shown in FIG. 4.
Figure 6:
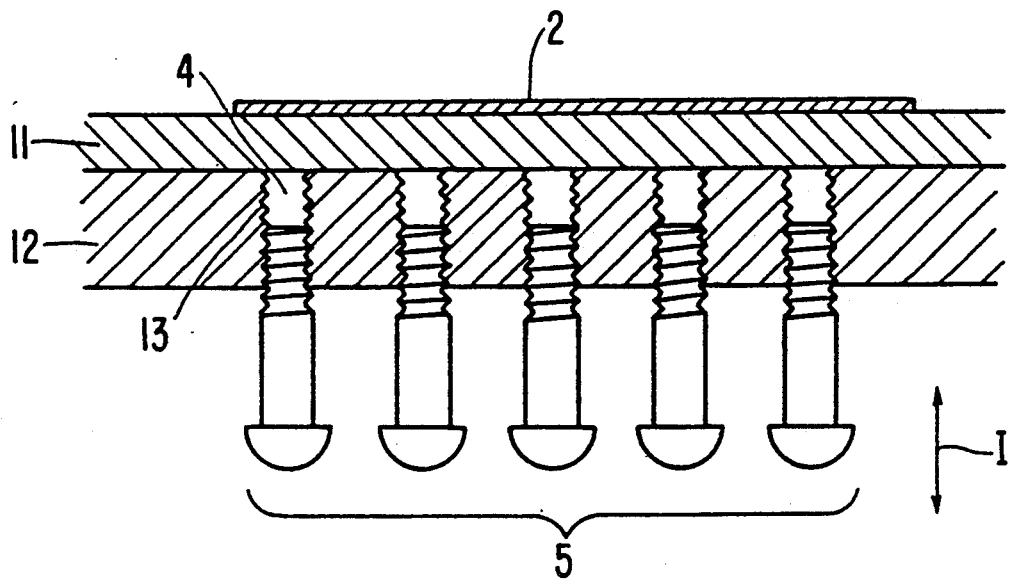
FIG. 6 is a sectional view taken along the line 11-11 of the directional coupler shown in FIG. 4.

FIG. 5 and FIG. 6 show an embodiment where a metal screw is used as the dielectric coefficient changing means 5. These sectional views are obtained by cutting along the lines 1—1 and 11—11 the directional coupling part of the present invention schematically shown in FIG. 4.

Namely, a threading hole 13 is cut in a housing of an automatic level control circuit located at a lower part of a dielectric substrate 11 loading the microstrip lines 2a, 2b of the directional coupler 2 shown in FIG. 4 and it is engaged with a screw 5. Thereby, the screw 5 may be moved in the direction of arrow mark A under the substrate 11.

When this automatic level control circuit operates normally, the screw 5 is inserted up to the position 1 as shown in FIG. 5.

In this case, the dielectric coefficient of gap 4 is determined most by that of the substrate 11. When the substrate 11 is formed, for example, by teflon, the dielectric coefficient is about 2.6 and therefore the dielectric coefficient of gap 4 becomes approximately 2.5. This dielectric coefficient results in a normal value of the input to the diode 3 during normal operation. Attenuation of the level at the gap 4 is, for example, about 30 dB, in this case.

On the other hand, when the screw 5 is moved downward to the position 5 of FIG. 5 during measurement of saturated power of amplifier 1, the dielectric coefficient of air (about 1.0) in the screw hole 13 influences the dielectric coefficient. Thus, the dielectric coefficient of the gap 4 as a whole becomes small. Thereby, coupling between the microstrip lines 2a-2b can be weakened. Attenuation of the level at the gap 4 in this case is, for example, about 40 dB and normal input of diode 3 (for example, 0 dB) can be acquired.

As explained above, for measurement of saturated power of the amplifier 1, it is enough to previously design the position of screw 5 in order to set the input to diode 3 within the normal range. Moreover, it is also allowed to remove the screw 5 from the substrate 11.

As explained above, the automatic level control circuit as the embodiment of the present invention provides means for changing a dielectric coefficient at a gap in a directional coupler. Accordingly, the present invention improves the reliability of the device because a stable and normal automatic level control operation can be continued without breakdown of the detector by simple positonal adjustment.

I claim:

1. A automatic level control circuit comprising:
   an amplifier;
   a detector; and
   a directional coupler, having a coupling part and operatively connected to said amplifier and said detector, for branching an output of said amplifier to keep constant an output level of said amplifier by detecting said branched output and preventing breakdown of said detector, said directional coupler providing means for changing a degree of coupling of the coupling part for directional coupling.

2. An automatic level control circuit according to claim 1, wherein said directional coupler comprises:
   a dielectric substrate; and
   at least two microstrip lines laid on said dielectric substrate, said microstrip lines provided in a closed area having a length equal to ¼ of a wavelength.

3. An automatic level control circuit according to claim 2, further comprising means for changing a dielectric coefficient, including metal screws inserted into holes and provided at said closed area of said at least two microstrip lines on said dielectric substrate.

4. A method of measuring saturated power of an amplifier having an output branched by a directional coupler, the branched output is detected by a detector and the gain thereof is controlled by the detected output, said method comprising a step of:
   (a) lowering a degree of coupling of the directional coupler to less than that during ordinary operation of the measurement of saturated power of the amplifier; and
   (b) preventing breakdown of the detector.

5. A method of measuring saturated power of an amplifier according to claim 4, wherein said directional coupler comprises a dielectric substrate, wherein said method further comprises:
   (b) forming at least two microstrip lines laid on the dielectric substrate, the microstrip lines provided in a closed area having a length equal to ¼ of a wavelength and coupling is carried out in the closed area, and wherein said step (a) comprises the substep of:
      (i) lowering the dielectric coefficient of the dielectric substrate at the closed area.

6. A method of measuring saturated power of an amplifier according to claim 5, further comprising the step of:
   (c) inserting metal screws into holes formed in the dielectric substrate; wherein said step (a) further comprises the substep of:
      (ii) reducing the insertion degree of the metal screws.

* * * * *